(12) United States Patent
Sun

(10) Patent No.: US 8,766,463 B2
(45) Date of Patent: Jul. 1, 2014

(54) PACKAGE CARRIER

(75) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 36 days.

(21) Appl. No.: 13/584,784

(22) Filed: Aug. 13, 2012

(65) Prior Publication Data

US 2013/0285252 A1   Oct. 31, 2013

(30) Foreign Application Priority Data

Apr. 26, 2012   (TW) .............................. 101114932 A

(51) Int. Cl.
  *H01L 23/48* (2006.01)
  *H01L 23/52* (2006.01)
  *H01L 29/40* (2006.01)

(52) U.S. Cl.
  USPC ............................ 257/784; 257/708; 257/700

(58) Field of Classification Search
  USPC ........................ 257/690, 700, 701, 708, 784
  See application file for complete search history.

(56) References Cited

U.S. PATENT DOCUMENTS

| 5,525,834 | A * | 6/1996 | Fischer et al. | 257/691 |
| 2011/0199772 | A1* | 8/2011 | Shibusawa et al. | 362/310 |
| 2011/0233782 | A1* | 9/2011 | Chang et al. | 257/753 |

FOREIGN PATENT DOCUMENTS

| TW | 552694 | 9/2003 |
| TW | 200903672 | 1/2009 |
| TW | 201010557 | 3/2010 |
| TW | 201041469 | 11/2010 |

OTHER PUBLICATIONS

"Office Action of Taiwan Counterpart Application", issued on Feb. 25, 2014, p1-p6, in which the listed references were cited.

* cited by examiner

*Primary Examiner* — Sheila V. Clark
(74) *Attorney, Agent, or Firm* — Jianq Chyun IP Office

(57) ABSTRACT

A package carrier includes a metal substrate, a pad, a dielectric layer, and a circuit layer. The metal substrate has a first surface and a second surface opposite to the first surface. The pad is disposed on the first surface. The dielectric layer is disposed on the first surface and covers the pad. A thickness of the dielectric layer is less than 150 μm. The circuit layer is embedded in the dielectric layer and connected to the pads.

18 Claims, 6 Drawing Sheets

PACKAGE CARRIER

CROSS-REFERENCE TO RELATED APPLICATION

This application claims the priority benefit of Taiwan application serial no. 101114932, filed on Apr. 26, 2012. The entirety of the above-mentioned patent application is hereby incorporated by reference herein and made a part of this specification.

BACKGROUND OF THE INVENTION

1. Field of the Invention

The invention relates to a package structure, and more particularly to a package carrier.

2. Description of Related Art

A chip package serves to both provide a chip with a proper signal transmission path as well as a proper heat dissipation path and protect the structure of the chip. According to the conventional wire bonding technology, a leadframe is often employed as a carrier of the chip. As contact density of a chip gradually increases, the leadframe which is no longer able to satisfy the requirement for high contact density may be replaced by a package carrier which can have favorable contact density. Besides, the chip is packaged onto the package carrier through a conductive medium, such as a metal conductive wire or a bump.

Generally, in order to form a package carrier, a core dielectric layer is often utilized as a core material, and circuit layers and dielectric layers are alternately stacked onto the core dielectric layer by performing a fully additive process, a semi-additive process, a subtractive process, or another process. Nonetheless, together with the reduction of device size and the increase in circuit complexity, plural circuit layers and dielectric layers are often required to be stacked onto the core dielectric layer, and thus the core dielectric layer must have sufficient thickness. Thereby, the overall thickness of the package carrier becomes significant, and thus it will be difficult to reduce the thickness of the package structure.

SUMMARY OF THE INVENTION

The invention is directed to a package carrier with a relatively thin thickness.

In an embodiment of the invention, a package carrier that includes a metal substrate, a pad, a first dielectric layer, and a first circuit layer. The metal substrate has a first surface and a second surface opposite to the first surface. The pad is disposed on the first surface. The first dielectric layer is disposed on the first surface and covers the pad. A thickness of the first dielectric layer is less than 150 µm. The first circuit layer is embedded in the first dielectric layer and connected to the pad.

According to an embodiment of the invention, a line width of the first circuit layer is less than 15 µm, for instance.

According to an embodiment of the invention, the package carrier further includes a passivation layer disposed on the first dielectric layer, and the passivation layer exposes the first circuit layer.

According to an embodiment of the invention, the package carrier further includes a surface treatment layer disposed on the first circuit layer.

According to an embodiment of the invention, the package carrier further includes a conductive layer that encapsulates the metal substrate.

According to an embodiment of the invention, the package carrier further includes a second dielectric layer, a second circuit layer, and a conductive via. The second dielectric layer is disposed on the first dielectric layer and covers the first circuit layer. The second circuit layer is embedded in the second dielectric layer. The conductive via is disposed in the second dielectric layer and connected to the first circuit layer and the second circuit layer.

According to an embodiment of the invention, a line width of the second circuit layer is less than 15 µm, for instance.

According to an embodiment of the invention, the package carrier further includes a passivation layer disposed on the second dielectric layer, and the passivation layer exposes the second circuit layer.

According to an embodiment of the invention, the package carrier further includes a surface treatment layer disposed on the second circuit layer.

In an embodiment of the invention, another package carrier that includes a metal substrate, a pad, a first dielectric layer, a first circuit layer, and a first conductive via is provided. The metal substrate has a first surface and a second surface opposite to the first surface. The pad is disposed on the first surface. The first dielectric layer is disposed on the first surface and covers the pad. A thickness of the first dielectric layer is less than 150 µm. The first circuit layer is disposed on the first dielectric layer. The first conductive via is disposed in the first dielectric layer and connected to the first circuit layer and the pad.

According to an embodiment of the invention, a line width of the first circuit layer is greater than or substantially equal to 15 µm, for instance.

According to an embodiment of the invention, the package carrier further includes a passivation layer disposed on the first dielectric layer, and the passivation layer exposes the first circuit layer.

According to an embodiment of the invention, the package carrier further includes a surface treatment layer disposed on the first circuit layer.

According to an embodiment of the invention, the package carrier further includes a conductive layer that encapsulates the metal substrate.

According to an embodiment of the invention, the package carrier further includes a second dielectric layer, a second circuit layer, and a second conductive via. The second dielectric layer is disposed on the first dielectric layer and covers the first circuit layer. The second circuit layer is disposed on the second dielectric layer. The second conductive via is disposed in the second dielectric layer and connected to the first circuit layer and the second circuit layer.

According to an embodiment of the invention, a line width of the second circuit layer is greater than or substantially equal to 15 µm, for instance.

According to an embodiment of the invention, the package carrier further includes a passivation layer disposed on the second dielectric layer, and the passivation layer exposes the second circuit layer.

According to an embodiment of the invention, the package carrier further includes a surface treatment layer disposed on the second circuit layer.

Based on the above, in the package carrier described in an embodiment of the invention, the thickness of the dielectric layer is less than 150 µm; hence, the package carrier and the resultant chip package structure containing the package carrier may have relatively small thickness. Moreover, when the circuit layer embedded in the dielectric layer refers to ultra-fine circuits, or when the circuit layer disposed on the dielectric layer refers to fine circuits, the layout density of the circuit layer in the package carrier may increase, and the number of circuit layers may be reduced. As such, both the thickness of the package carrier and the overall thickness of the resultant chip package structure may be reduced.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
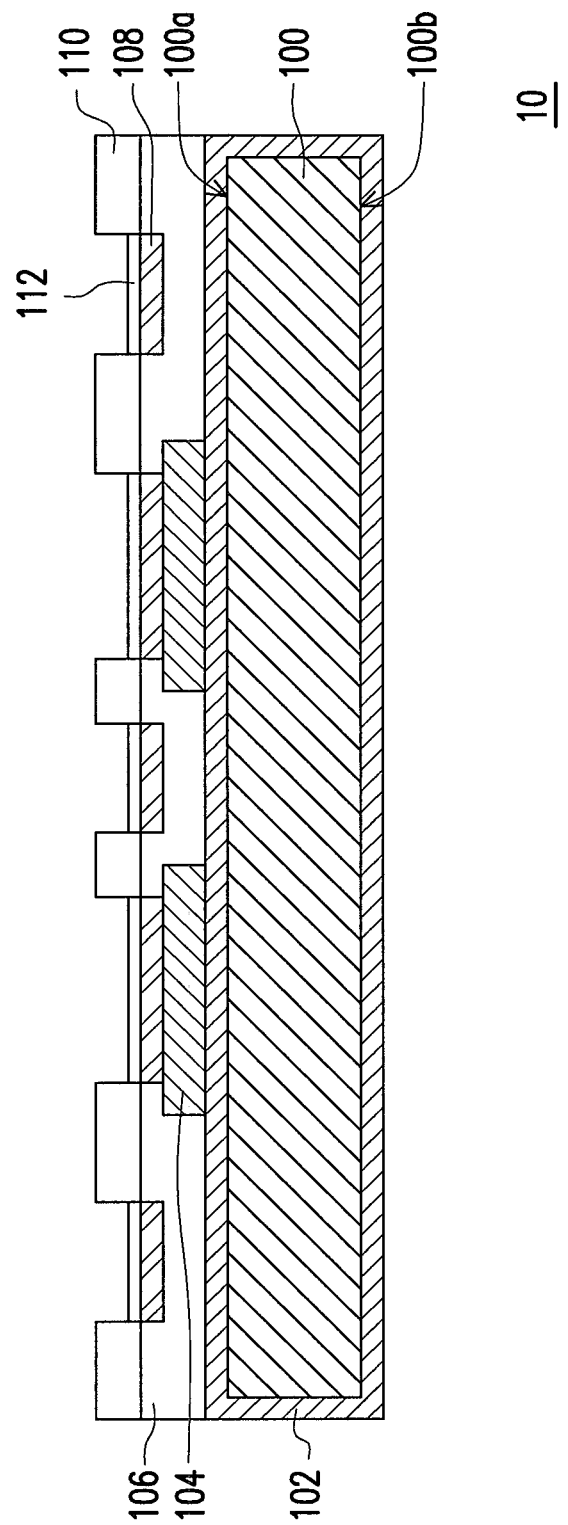
FIG. 1 is a schematic cross-sectional view illustrating a package carrier according to an embodiment of the invention.

FIG. 1 is a schematic cross-sectional view illustrating a package carrier according to an embodiment of the invention. With reference to FIG. 1, the package carrier 10 includes a metal substrate 100, a conductive layer 102, pads 104, a dielectric layer 106, and a circuit layer 108. According to the present embodiment as shown in FIG. 1, two pads 104 are illustrated, which should however not be construed as a limitation to the invention. The metal substrate 100 has a surface 100a and a surface 100b opposite to the surface 100a. A material of the metal substrate 100 is, for instance, aluminum, copper, or alloy thereof, which should however not be construed as a limitation to the invention. The conductive layer 102 encapsulates the metal substrate 100. The pads 104 are disposed on the surface 100a. The conductive layer 102 is, for instance, a chemical copper layer and serves as a seed layer in the process of forming the pads 104 through plating. Certainly, in another embodiment of the invention, the pads 104 may be formed on the surface 100a through deposition. In this case, the conductive layer 102 is not required.

The dielectric layer 106 is disposed on the surface 100a and covers the pads 104. Here, a thickness of the dielectric layer 106 is less than 150 μm, and a material of the dielectric layer 106 is, for instance, epoxy resin (e.g., ABF resin) containing glass particles. The circuit layer 108 is embedded in the dielectric layer 106 and connected to the pads 104.

Besides, the package carrier 10 described in the present embodiment further includes a passivation layer 110 and a surface treatment layer 112. The passivation layer 110 is disposed on the dielectric layer 106 and exposes the circuit layer 108. Besides, the passivation layer 110 may act as a solder mask layer. The surface treatment layer 112 is disposed on the circuit layer 108. Here, the surface treatment layer 112 is, for instance, a nickel layer, a gold layer, a silver layer, or a nickel palladium gold layer, which should however not be construed as a limitation to the invention. Through the surface treatment layer 112, conductive wires are apt to be electrically connected to the circuit layer 108 when chips are subsequently configured through wire bonding. Certainly, in other embodiments, it is possible to selectively omit the passivation layer 110 and/or the surface treatment layer 112 based on actual demands.

In the present embodiment, the line width of the circuit layer 108 is less than 15 μm, for instance. Namely, the circuit layer 108 may refer to the so-called ultra-fine circuits. Thereby, the layout density of the circuit layer in the dielectric layer 106 may be effectively raised, and the number of the circuit layers in the package carrier and in the resultant chip package structure containing the package carrier can be reduced.

In addition, after a chip is bonded to the package carrier 10, and after the molding compound is formed, the metal substrate 100 and the conductive layer 102 are removed, and solder balls are then formed on the pads 104, so as to form the chip package structure. The chip package structure is described below with reference to FIG. 2.

Figure 2:
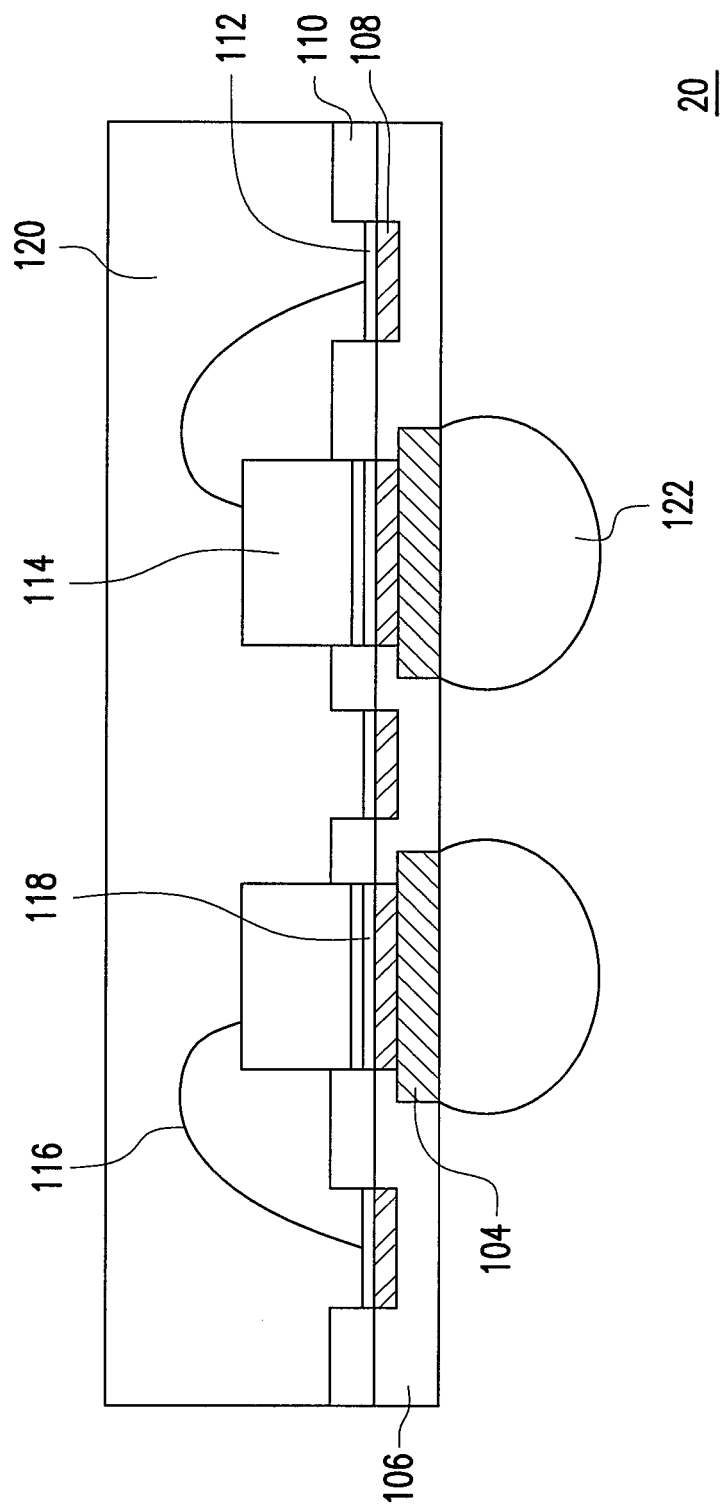
FIG. 2 is a schematic cross-sectional view illustrating a chip package structure according to an embodiment of the invention.

As indicated in FIG. 2, in the chip package structure 20, the chips 114 are configured on a portion of the circuit layer 108 and connected to the surface treatment layer 112 through conductive wires 116, such that the chips 114 are electrically connected to the circuit layer 108. Besides, an adhesion layer 118 is configured below each chip 114, such that the chips 114 are fixed onto the circuit layer 108. The molding compound 120 encapsulates the passivation layer 110, the surface treatment layer 112, the chips 114, and the conductive wires 116. The solder balls 122 are disposed on the pads 104, so that the chip package structure 20 may be connected to an external electronic device.

In the chip package structure 20, the thickness of the dielectric layer 106 is less than 150 μm, and thus the chip package structure 20 may have a relatively small thickness. Additionally, the circuit layer 108 may refer to the ultra-fine circuits; therefore, the layout density of the circuit layer in the dielectric layer 106 may be raised, and the number of circuit layers in the chip package structure 20 may be reduced. As such, the overall thickness of the chip package structure 20 is reduced.

In the package carrier 10, it should be mentioned that the pads 104 and the circuit layer 108 are embedded in the dielectric layer 106. That is, the package carrier 10 has two layers of circuits, which should however not be construed as a limitation to the invention. In other embodiments, the package carrier may have three or more layers of circuits.

Figure 3:
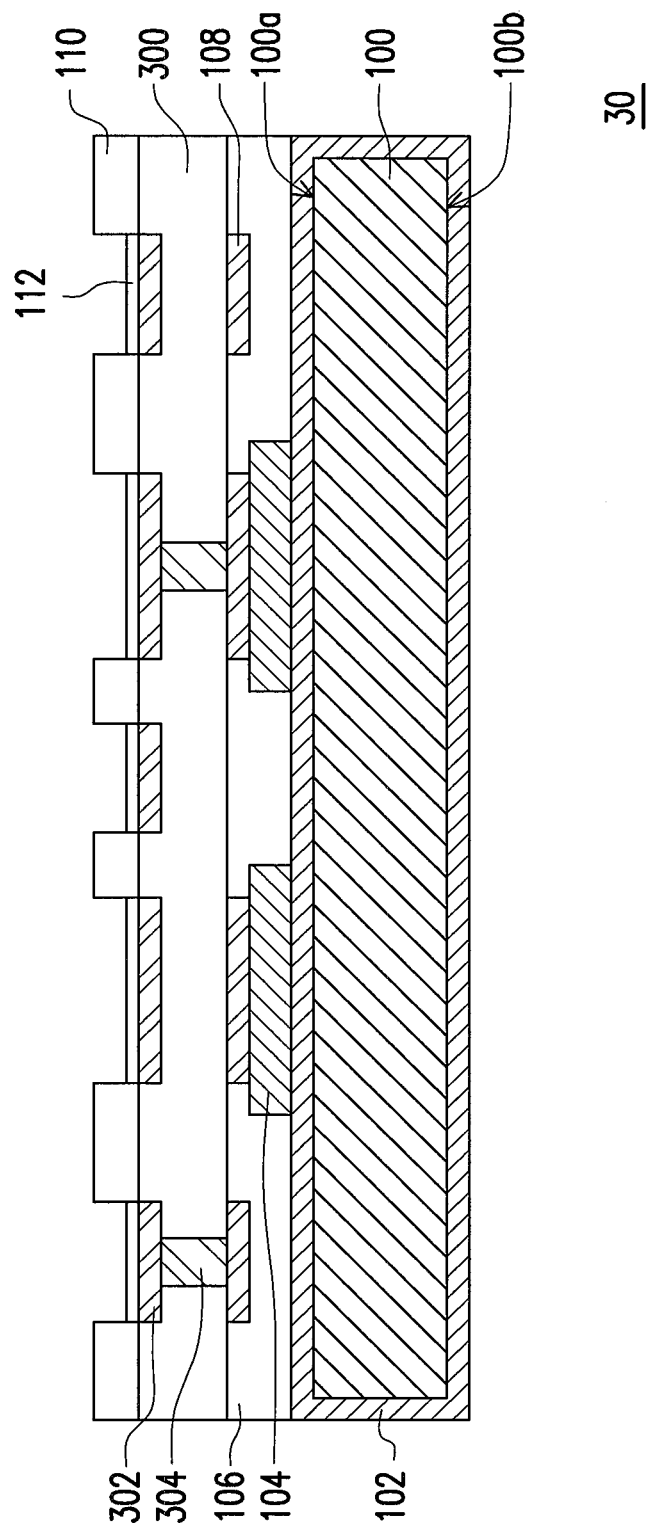
FIG. 3 is a schematic cross-sectional view illustrating a package carrier according to another embodiment of the invention.

FIG. 3 is a schematic cross-sectional view illustrating a package carrier according to another embodiment of the invention. The same components in FIG. 1 and FIG. 3 are denoted by the same reference numerals, and the description thereof is omitted hereinafter. With reference to FIG. 3, the difference between the package carrier 30 and the package carrier 10 lies in that the package carrier 30 further includes a dielectric layer 300, a circuit layer 302, and a conductive via 304. The dielectric layer 300 is disposed on the dielectric layer 106 and covers the circuit layer 108, and a material of the dielectric layer 300 is, for instance, epoxy resin (e.g., ABF resin) containing glass particles. The circuit layer 302 is embedded in the dielectric layer 300. The conductive via 304 is disposed in the dielectric layer 300 and connected to the circuit layer 108 and the circuit layer 302. The passivation layer 110 is disposed on the dielectric layer 300 and exposes the circuit layer 302. The surface treatment layer 112 is disposed on the circuit layer 302.

In the present embodiment, the thickness of the dielectric layer 106 and the thickness of the dielectric layer 300 are both less than 150 μm, and the line width of the circuit layer 108 and the line width of the circuit layer 302 are, for instance, both less than 15 μm. Thereby, the package carrier 30 containing three layers of circuits may also have a relatively thin thickness and high layout density.

According to the previous embodiments, the circuit layer is embedded in the dielectric layer, whereas the circuit layer may also be disposed on the dielectric layer according to another embodiment.

Figure 4:
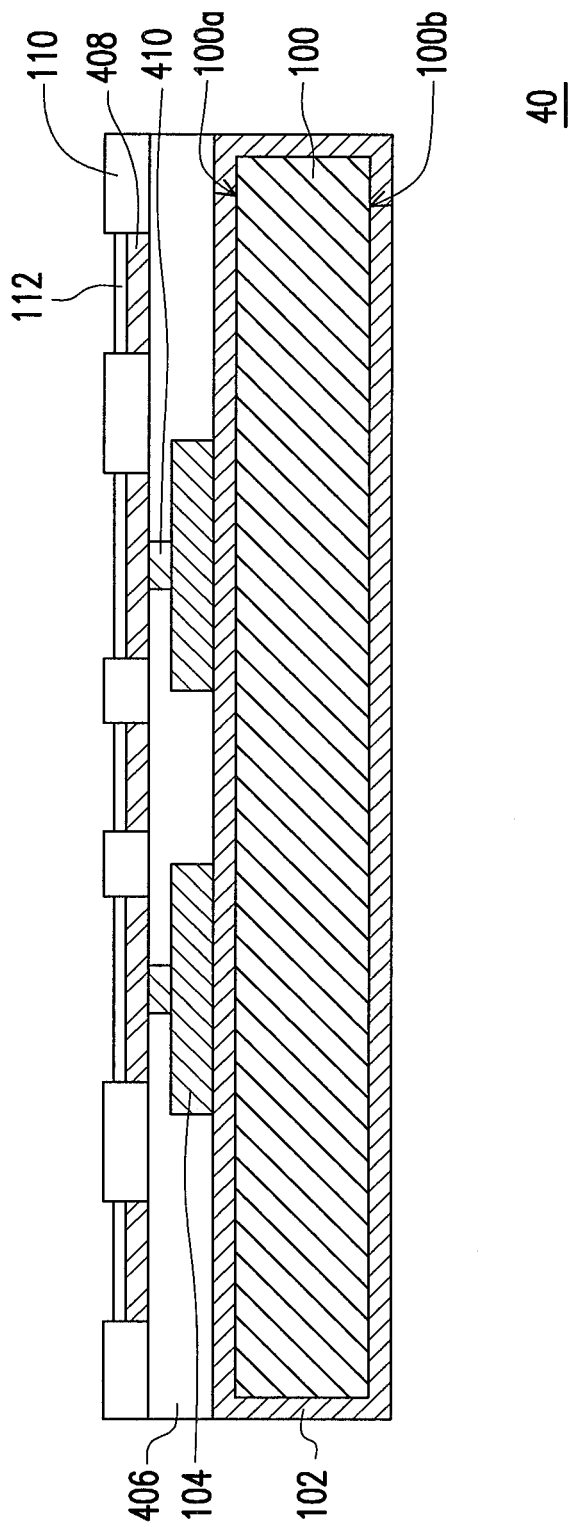
FIG. 4 is a schematic cross-sectional view illustrating a package carrier according to yet another embodiment of the invention.

FIG. 4 is a schematic cross-sectional view illustrating a package carrier according to yet another embodiment of the invention. With reference to FIG. 4, the difference between the package carrier 40 and the package carrier 10 lies in that the circuit layer 408 in the package carrier 40 is disposed on the dielectric layer 406 and connected to the pads 104 through the conductive via 410. The line width of the circuit layer 408 is greater than or substantially equal to 15 μm, for instance. Namely, the circuit layer 408 may refer to the so-called fine circuits. As such, the layout density of the circuit layer in the dielectric layer 406 may be effectively improved. The thickness of the dielectric layer 406 is less than 150 μm. Since the circuit layer 408 is disposed on the dielectric layer 406 rather than being embedded in the dielectric layer 406, the material of the dielectric layer 406 includes but is not limited to ABF resin. Certainly, in other embodiments, it is possible to selectively omit the passivation layer 110 and/or the surface treatment layer 112 based on actual demands.

Figure 5:
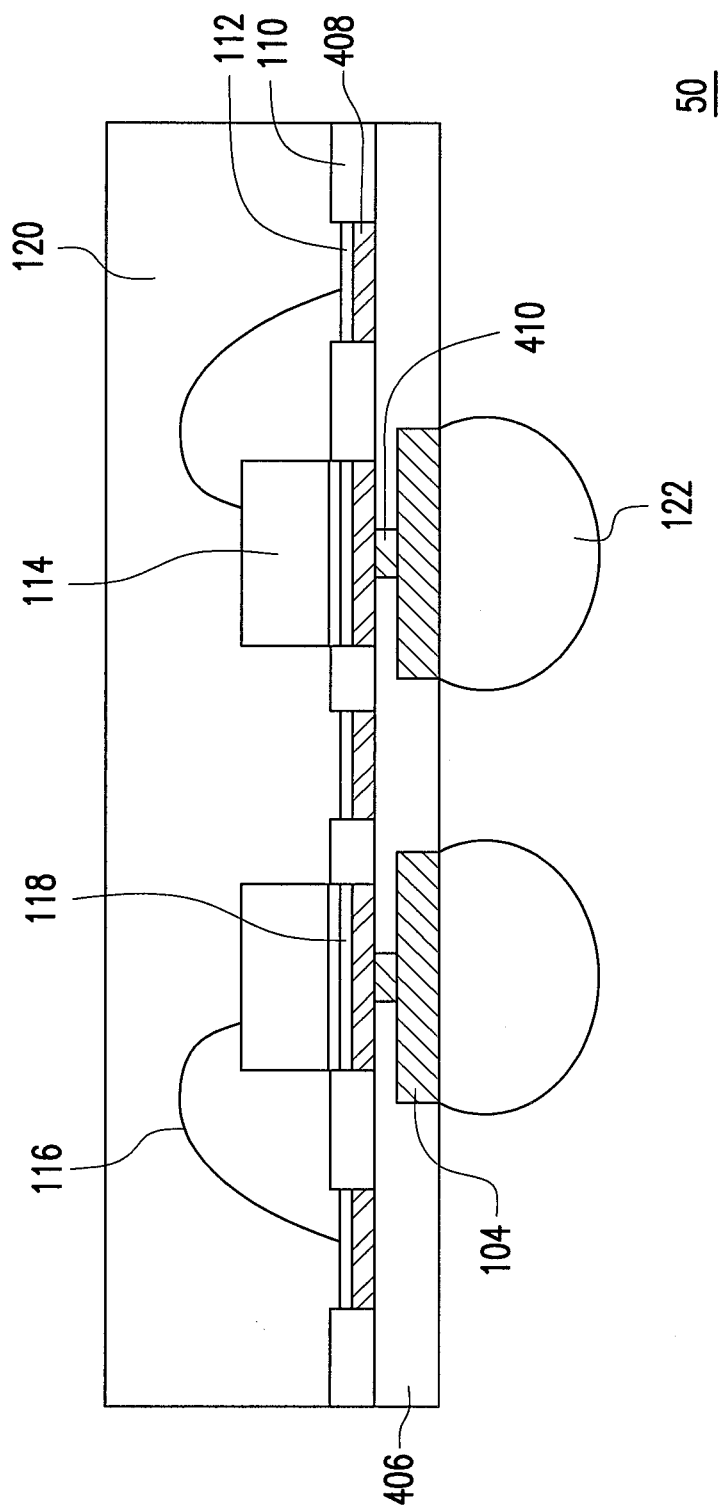
FIG. 5 is a schematic cross-sectional view illustrating a chip package structure according to another embodiment of the invention.

Similarly, after a chip is bonded to the package carrier 40, and after the molding compound is formed, the metal substrate 100 and the conductive layer 102 are removed, and solder balls are then formed on the pads 104, so as to form the chip package structure 50, as indicated in FIG. 5. The same components in FIG. 2 and FIG. 5 are denoted by the same reference numerals, and the description thereof is omitted hereinafter. With reference to FIG. 5, in the chip package structure 50, the thickness of the dielectric layer 406 is less than 150 μm, and thus the chip package structure 50 may have a relatively small thickness. Additionally, the circuit layer 408 may refer to fine circuits; therefore, the layout density of the circuit layer in the dielectric layer 406 may be raised, and the number of circuit layers in the chip package structure 50 may be reduced. As such, the overall thickness of the chip package structure 50 is reduced.

Figure 6:
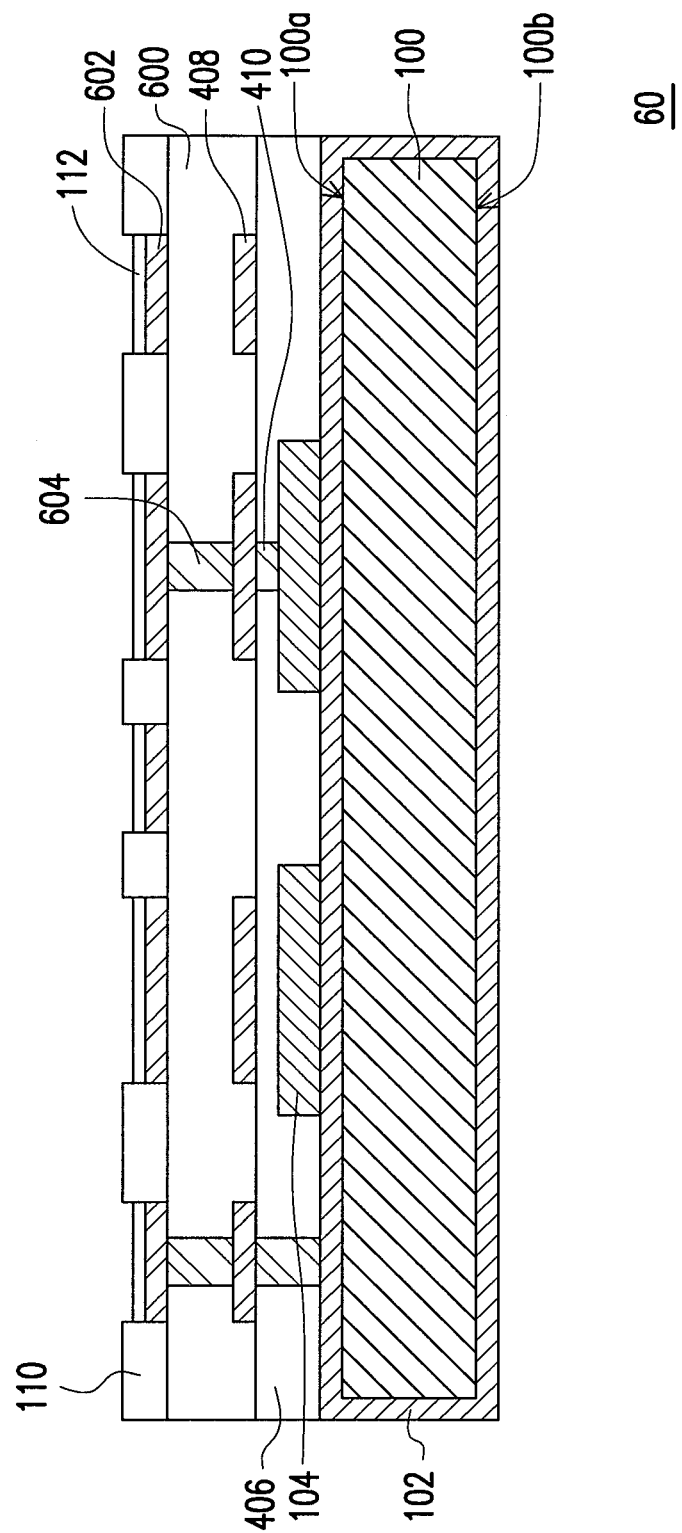
FIG. 6 is a schematic cross-sectional view illustrating a package carrier according to yet another embodiment of the invention.

FIG. 6 is a schematic cross-sectional view illustrating a package carrier according to yet another embodiment of the invention. The same components in FIG. 4 and FIG. 6 are denoted by the same reference numerals, and the description thereof is omitted hereinafter. With reference to FIG. 6, the difference between the package carrier 60 and the package carrier 40 lies in that the package carrier 60 further includes a dielectric layer 600, a circuit layer 602, and a conductive via 604. The dielectric layer 600 is disposed on the dielectric layer 406 and covers the circuit layer 408. A material of the dielectric layer 600 is the same as the material of the dielectric layer 406, for instance. The circuit layer 602 is disposed on the dielectric layer 600. The conductive via 604 is disposed in the dielectric layer 600 and connected to the circuit layer 408 and the circuit layer 602. The passivation layer 110 is disposed on the dielectric layer 600 and exposes the circuit layer 602. The surface treatment layer 112 is disposed on the circuit layer 602.

In the present embodiment, the thickness of the dielectric layer 406 and the thickness of the dielectric layer 600 are both less than 150 μm, and the line width of the circuit layer 408 and the line width of the circuit layer 602 are, for instance, both greater than or substantially equal to 15 μm (i.e., the circuit layers 408 and 602 refer to the so-called fine circuits). Thereby, the package carrier 60 containing three layers of circuits may also have a relatively thin thickness and high layout density.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A package carrier comprising:
    a metal substrate having a first surface and a second surface opposite to the first surface;
    a pad disposed on the first surface;
    a first dielectric layer disposed on the first surface and covering the pad, a thickness of the first dielectric layer being less than 150 μm, wherein the pad is embedded in the first dielectric layer; and
    a first circuit layer embedded in the first dielectric layer and connected to the pad.

2. The package carrier as recited in claim 1, wherein a line width of the first circuit layer is less than 15 μm.

3. The package carrier as recited in claim 1, further comprising a passivation layer disposed on the first dielectric layer, the passivation layer exposing the first circuit layer.

4. The package carrier as recited in claim 1, further comprising a surface treatment layer disposed on the first circuit layer.

5. The package carrier as recited in claim 1, further comprising a conductive layer encapsulating the metal substrate.

6. The package carrier as recited in claim 1, further comprising:
    a second dielectric layer disposed on the first dielectric layer and covering the first circuit layer;
    a second circuit layer embedded in the second dielectric layer; and
    a conductive via disposed in the second dielectric layer and connected to the first circuit layer and the second circuit layer.

7. The package carrier as recited in claim 6, wherein a line width of the second circuit layer is less than 15 μm.

8. The package carrier as recited in claim 6, further comprising a passivation layer disposed on the second dielectric layer, the passivation layer exposing the second circuit layer.

9. The package carrier as recited in claim 6, further comprising a surface treatment layer disposed on the second circuit layer.

10. A package carrier comprising:
    a metal substrate having a first surface and a second surface opposite to the first surface;
    a pad disposed on the first surface;
    a first dielectric layer disposed on the first surface and covering the pad, a thickness of the first dielectric layer being less than 150 μm, wherein the pad is embedded in the first dielectric layer;
    a first circuit layer disposed on the first dielectric layer; and
    a first conductive via disposed in the first dielectric layer and connected to the first circuit layer and the pad.

11. The package carrier as recited in claim 10, wherein a line width of the first circuit layer is greater than or substantially equal to 15 μm.

12. The package carrier as recited in claim 10, further comprising a passivation layer disposed on the first dielectric layer, the passivation layer exposing the first circuit layer.

13. The package carrier as recited in claim 10, further comprising a surface treatment layer disposed on the first circuit layer.

14. The package carrier as recited in claim 10, further comprising a conductive layer encapsulating the metal substrate.

15. The package carrier as recited in claim 10, further comprising:
- a second dielectric layer disposed on the first dielectric layer and covering the first circuit layer;
- a second circuit layer disposed on the second dielectric layer; and
- a second conductive via disposed in the second dielectric layer and connected to the first circuit layer and the second circuit layer.

16. The package carrier as recited in claim 15, wherein a line width of the second circuit layer is greater than or substantially equal to 15 μm.

17. The package carrier as recited in claim 15, further comprising a passivation layer disposed on the second dielectric layer, the passivation layer exposing the second circuit layer.

18. The package carrier as recited in claim 15, further comprising a surface treatment layer disposed on the second circuit layer.

* * * * *